United States Patent
Kim et al.

(10) Patent No.: US 12,119,210 B2
(45) Date of Patent: Oct. 15, 2024

(54) FASTENING AUTOMATION APPARATUS FOR UPPER ELECTRODE

(71) Applicant: SAMSUNG ELECTRONICS CO., LTD., Suwon-si (KR)

(72) Inventors: Joohee Kim, Ansan-si (KR); Hyunjung Lee, Hwaseong-si (KR); Sungwook Jung, Seoul (KR); Sunho Kim, Seoul (KR); Sungjin Kim, Suwon-si (KR); Jungwook Kim, Seongnam-si (KR); Hosun Yoo, Seongnam-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 862 days.

(21) Appl. No.: 17/213,017

(22) Filed: Mar. 25, 2021

(65) Prior Publication Data
US 2022/0068609 A1  Mar. 3, 2022

(30) Foreign Application Priority Data
Aug. 31, 2020 (KR) .......... 10-2020-0110519

(51) Int. Cl.
*H01J 37/32* (2006.01)
(52) U.S. Cl.
CPC .. *H01J 37/32532* (2013.01); *H01J 37/32642* (2013.01)
(58) Field of Classification Search
CPC .......... H01J 37/32532; H01J 37/32577; H01J 37/32642
See application file for complete search history.

(56) References Cited

U.S. PATENT DOCUMENTS

| | | | |
|---|---|---|---|
| 5,579,572 A * | 12/1996 | Kashiwagi | H05K 13/041 414/752.1 |
| 6,047,455 A | 4/2000 | Hansson | |
| 7,481,903 B2 | 1/2009 | Senzaki et al. | |
| 10,262,834 B2 | 4/2019 | De La Llera et al. | |
| 10,529,601 B2 * | 1/2020 | Koch | H05K 13/021 |
| 2003/0127433 A1 | 7/2003 | Sirkis et al. | |
| 2010/0236717 A1 | 9/2010 | Chung et al. | |

(Continued)

FOREIGN PATENT DOCUMENTS

KR  101346081 B1  12/2013
KR  20190088888 A  7/2019

OTHER PUBLICATIONS

"Request for the Submission of an Opinion" and English language translation, KR Application No. 10-2020-0110519, Jul. 15, 2024, 15 pp.

*Primary Examiner* — Minh N Trinh
(74) *Attorney, Agent, or Firm* — Myers Bigel, P.A.

(57) ABSTRACT

A fastening automation apparatus for an upper electrode of an etching facility includes a ring, and a plurality of fastening modules movably secured to the ring and configured to be movable in a radial direction on the ring. Each fastening module includes a first frame that is movable in a radial direction on the ring, a driving source installed below the first frame, a driving shaft that transmits a driving force from the driving source, a power transmission unit connected to the driving shaft, and a fastening bit connected to the power transmission unit and configured to be rotated. The plurality of fastening modules are configured to operate simultaneously to install the upper electrode in the etching facility.

20 Claims, 5 Drawing Sheets

(56) References Cited

U.S. PATENT DOCUMENTS

| | | |
|---|---|---|
| 2013/0337654 A1 | 12/2013 | Patrick et al. |
| 2018/0201061 A1 | 7/2018 | Black |
| 2020/0348335 A1 | 11/2020 | Park et al. |
| 2022/0068609 A1* | 3/2022 | Kim .................. H01J 37/32642 |

* cited by examiner

FASTENING AUTOMATION APPARATUS FOR UPPER ELECTRODE

CROSS-REFERENCE TO RELATED APPLICATION(S)

This application claims benefit of priority to Korean Patent Application No. 10-2020-0110519 filed on Aug. 31, 2020 in the Korean Intellectual Property Office, the disclosure of which is incorporated by reference herein in its entirety.

BACKGROUND

The present inventive concept relates to a fastening automation apparatus for an upper electrode.

In general, in an etching process facility, components such as upper electrodes, or the like, are replaced, when performing maintenance and repair operations. However, after performing a maintenance and repair operation, there may be a problem wherein an error occurs in an operating condition in one or more chambers, and the facility may have to be stopped in order to perform additional maintenance and repair operations. This may lead to lower productivity, which is undesirable.

SUMMARY

An aspect of the present inventive concept is to provide a fastening automation apparatus for an upper electrode in which a contact area between an upper electrode and an etching facility may be evenly distributed throughout the upper electrode.

According to an aspect of the present inventive concept, a fastening apparatus includes a ring, and a plurality of fastening modules movably secured to the ring, each fastening module configured to be movable in a radial direction on the ring. Each fastening module includes a first frame that is movable in a radial direction, a driving source installed below the first frame, a driving shaft that is configured to transmit a driving force from the driving source, a power transmission unit connected to the driving shaft, and a fastening bit connected to the power transmission portion and configured to be rotated. The plurality of fastening modules are configured to operate simultaneously to install an upper electrode of an etching facility in the etching facility.

A fastening apparatus includes a ring, and a plurality of fastening modules movably secured to the ring. Each fastening module has a first frame installed on the ring so as to be movable in a radial direction, a driving source installed in the first frame, and a fastening bit connected to the driving source that is configured to rotate. When an upper electrode of an etching facility is installed in the etching facility, the first frame of each of the plurality of fastening modules is moved and the fastening bit of each of the plurality of fastening modules is inserted into a respective cam nut of the upper electrode and rotated at the same time.

A fastening apparatus includes a ring, and a plurality of fastening modules movably secured to the ring. Each fastening module includes a driving source, a power transmission unit, a fastening bit connected to the power transmission unit, and a driving shaft operably connected to the driving source and to the power transmission unit, wherein rotation of the driving shaft by the driving source causes rotation of the fastening bit via the power transmission unit.

The fastening apparatus also includes a control unit that is configured to operate the plurality of fastening modules simultaneously.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, preferred example embodiments of the present inventive concept will be described with reference to the accompanying drawings.

Figure 1:
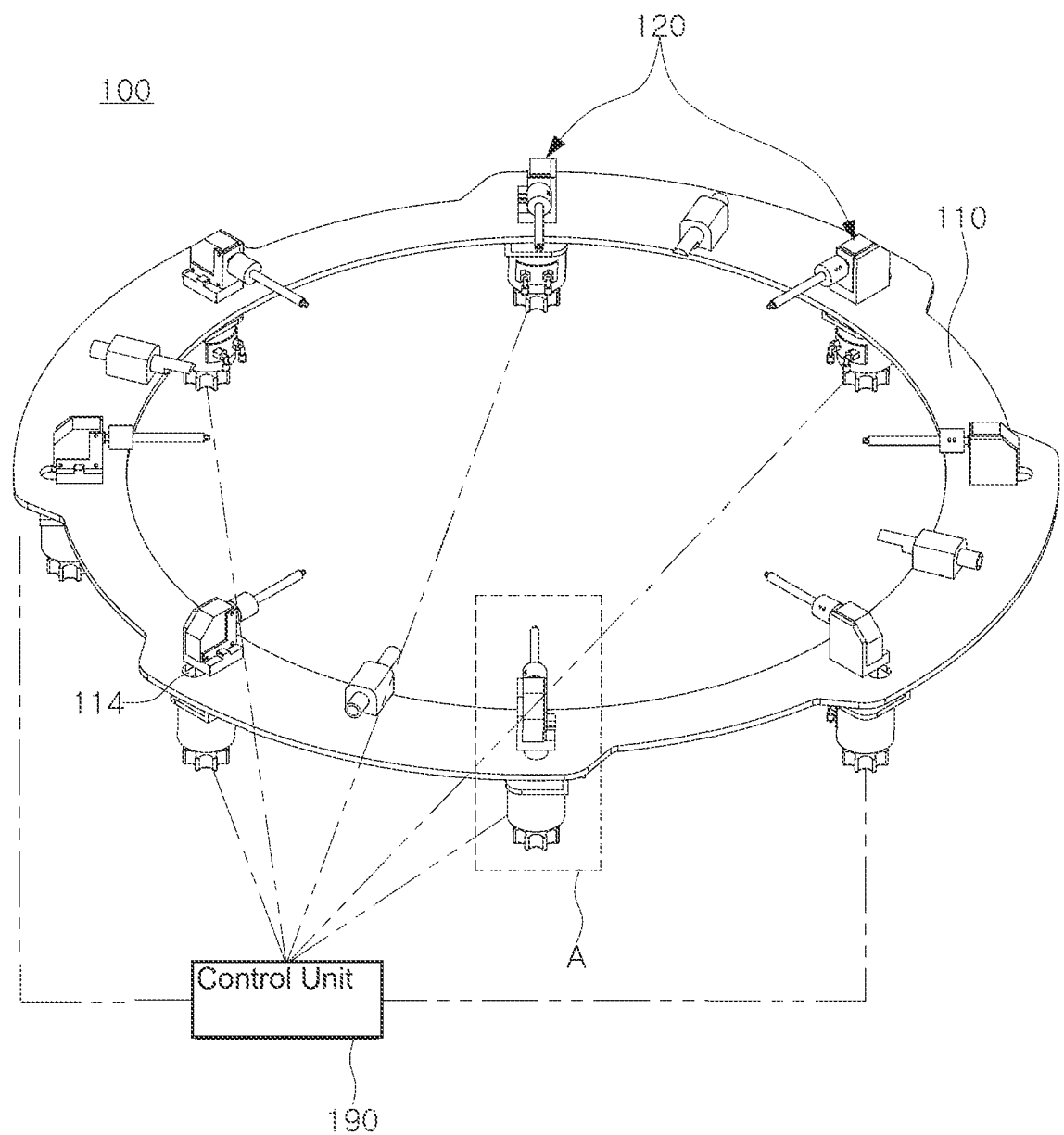
FIG. 1 is a perspective view illustrating a fastening automation apparatus for an upper electrode according to an example embodiment.
Figure 2:
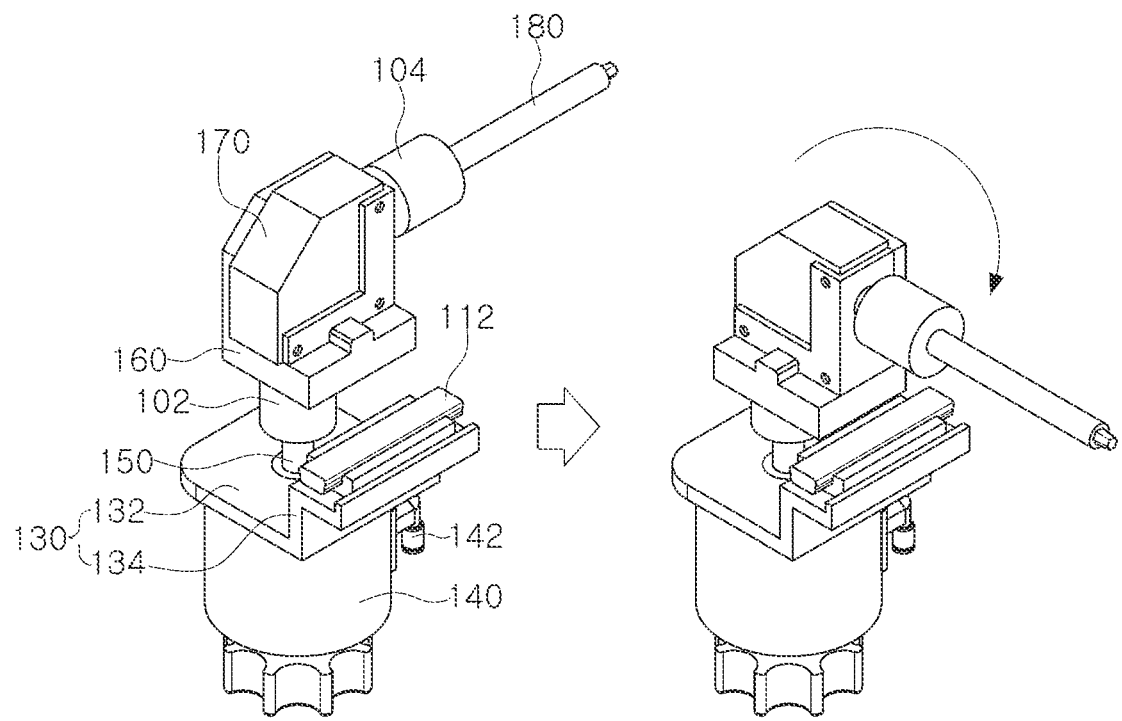
FIG. 2 is an enlarged view illustrating part A of FIG. 1.
Figure 3:
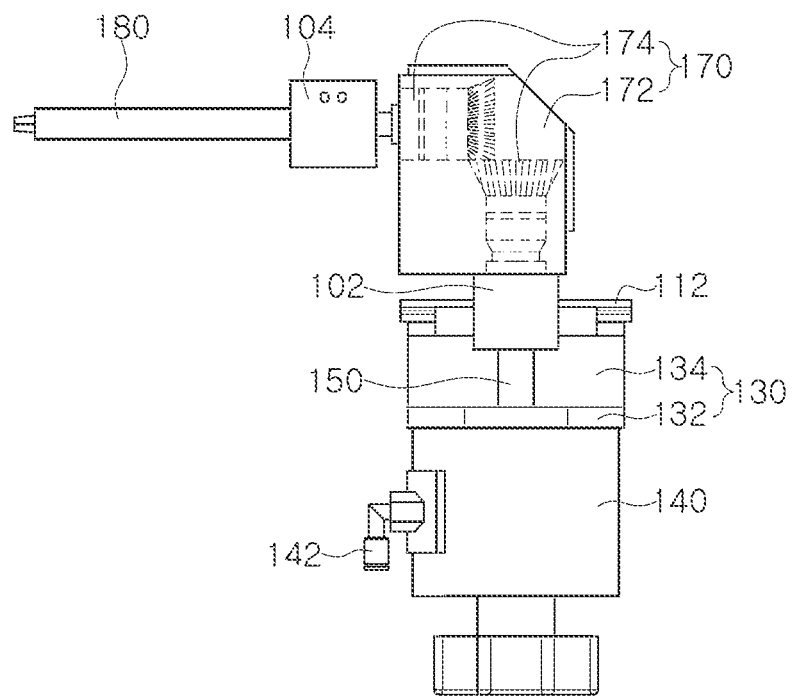
FIG. 3 is a side surface view illustrating a fastening automation module for an upper electrode according to an example embodiment.

FIG. 1 is a perspective view illustrating a fastening automation apparatus for an upper electrode according to an example embodiment, FIG. 2 is an enlarged view illustrating part A of FIG. 1, and FIG. 3 is a side surface view illustrating a fastening automation module for an upper electrode according to an example embodiment.

Referring to FIGS. 1 to 3, a fastening apparatus 100 for an upper electrode may be configured to include a ring 110, a plurality of fastening modules 120 movably secured to the ring 110, and a control unit 190, as an example.

The ring 110 may have a circular ring shape with a central opening so that an upper electrode 10 (see FIGS. 4 and 5) of an etching facility (not shown) to be described later may be disposed therein. As an example, an inner diameter of the ring 110 may be formed to be larger than the upper electrode 10 so that the upper electrode 10 may be disposed inside the ring 110.

A guide member 112 (see FIG. 2) for moving a respective fastening module 120 in a radial direction may be provided on a bottom side of the ring 110. In the illustrated embodiment, a guide member 112 is provided for each of the plurality of fastening modules 120 such that each fastening module 120 can be independently moved relative to the ring 110. In addition, each guide member 112 may be a linear motion (LM) guide, for example. However, the present inventive concept is not limited to the guide members 112 being LM guides. Various types of guides capable of guiding the movement of a fastening module 120 in the radial direction may be employed.

The ring 110 may be provided with a respective through-hole 114 for each fastening module 120, as illustrated in FIG. 1. Each through-hole 114 may have an elliptical shape for guiding the movement of a driving shaft 150 associated with a fastening module 120 when the fastening module 120 moves in the radial direction, as will be described later.

As shown in FIG. 1, a plurality of fastening modules 120 are installed on the ring 110 and configured to be movable in a radial direction. As an example, eight fastening modules 120 may be disposed in circumferential spaced apart relation around the ring 110. The fastening modules 120 may be spaced apart from each other at equal intervals, in some embodiments, as illustrated in FIG. 1. However, the number of fastening modules 120 is not limited to any particular number or spacing of fastening modules 120. The number of fastening modules 120 and the arrangement of fastening modules 120 on the ring 110 is dictated by the number and arrangement of cam nuts 12 installed on an upper electrode 10.

As used herein, the term "radial direction" refers to a direction from an inner circumferential surface of the ring 110 toward an outer circumferential surface or from the outer circumferential surface of the ring 110 toward the inner circumferential surface of the ring 110, and the term "circumferential direction" refers to a direction around the inner circumferential surface of the ring 110.

Meanwhile, as shown in more detail in FIGS. 2 and 3, each fastening module 120 may be configured to include, for example, a first frame 130, a driving source 140, a driving shaft 150, a second frame 160, a power transmission portion 170, and a fastening bit 180.

The first frame 130 is installed to be movable in a radial direction on the ring 110. As an example, the first frame 130 may be installed on the guide member 112 shown in FIG. 3 and configured to be moved in a radial direction.

In addition, a hole (not shown) through which the driving shaft 150 penetrates may be provided in the first frame 130. As an example, the first frame 130 may include an installation plate 132 on which the driving source 140 is installed, and a connection portion 134 extending from the installation plate 132 that is connected to the guide member 112.

The driving source 140 is fixedly installed on the first frame 130. As an example, the driving source 140 may be fixedly installed on a bottom surface of the installation plate 132. The driving source 140 is provided with a pneumatic port 142, and the driving source 140 may generate driving force by air supplied from the pneumatic port 142. As an example, the driving source 140 may be a rotary cylinder. However, the present inventive concept is not limited thereto, and the driving source 140 may be formed of a motor, or the like, capable of generating rotational force by the supplied power.

The driving shaft 150 is connected to the driving source 140 and serves to transmit driving force. Meanwhile, the driving shaft 150 is disposed to penetrate through the first frame 130, and to penetrate through a respective through-hole 114 provided in the ring 110. In addition, the driving shaft 150 is connected to the power transmission portion 160 to transmit rotational force to the power transmission unit 160.

As an example, the driving shaft 150 may be connected to the power transmission unit 160 by a first coupler 102.

The second frame 160 is connected to the driving shaft 150 so as to be disposed above the ring 110. In addition, a power transmission unit 170 may be installed on the second frame 160. Accordingly, when the driving shaft 150 rotates, the second frame 160 rotates together with the driving shaft 150 so that the power transmission unit 170 and the fastening bit 180 may be rotated. For example, as shown in FIG. 2, when the driving shaft 150 is rotated by the driving source 140 in a state in which the fastening bit 180 is disposed toward the center of the ring 110, the second frame 160 may be rotated so that the fastening bit 180 is disposed above the ring 110.

When the fastening bit 180 is coupled to a cam nut 12 of the upper electrode 10, the second frame 160 is not rotated, even if the driving shaft 150 is rotated by the driving source 140. That is, the second frame 160 may be constrained by the fastening bit 180 coupled to the cam nut 12 of the upper electrode 10 so that the second frame 160 may not rotate. However, when the restraint of the second frame 160 is released, the second frame 160 may be rotated by the driving source 140.

The power transmission unit 170 is fixedly installed on the second frame 160. The power transmission unit 170 is connected to the driving shaft 150 and serves to convert a rotational direction of rotational force transmitted from the driving shaft 150. As an example, as shown in FIG. 3, the power transmission unit 170 may include a case 172 and a pair of bevel gears 174. One of the bevel gears 174 is connected to the driving shaft 150 and the other thereof is connected to the fastening bit 180 so that the fastening bit 180 is rotated. In other words, rotation of the driving shaft 150 causes rotation of the fastening bit 180 because of the bevel gears 174. The bevel gears 174 are configured to convert rotation of the driving shaft 150 about a first axis into rotation of the fastening bit 180 about a second axis that is oriented obliquely or perpendicular to the first axis.

The fastening bit 180 is connected to the power transmission unit 170 and is configured to rotate. In addition, the fastening bit 180 may be connected to the power transmission unit 170 through a second coupler 104. As an example, the fastening bit 180 may have a cross-sectional shape whose end corresponds to the shape of the inner circumferential surface of the upper electrode 10, and may have a bar shape as a whole. The end of the fastening bit 180 may have a polygonal shape such as an octagonal or hexagonal cross-section, although other shapes may be utilized. As described above, when the fastening bit 180 is rotated while being inserted into the cam nut 12 of the upper electrode 10, the cam nut 12 is rotated and a cam bolt (not shown) provided in an etching facility (not shown) is moved to install the upper electrode 10 in the etching facility.

A control unit 190 (FIG. 1) is connected to the driving source 140 of each of the fastening modules 120. When the fastening bits 180 of the plurality of fastening modules 120 are inserted into the respective cam nuts 12, the control unit 190 may drive the driving sources 140 of the plurality of fastening modules 120 at the same time to rotate the cam nuts 12.

As described above, the cam nuts 12 of the upper electrode 10 are rotated simultaneously by the plurality of fastening modules 120 to install the upper electrode 10 of the etching facility in the etching facility. Accordingly, by rotating the cam nuts 12 with the same torque to install the upper electrode in the etching facility, the upper electrode 10 can achieve even surface contact in the etching facility. Accordingly, a defect of temperature distribution caused by uneven surface contact may be avoided.

Conventionally, when each cam nut 12 of an upper electrode 10 is rotated by an operator, a problem may occur in that an area in which the upper electrode 10 contacts the etching facility is not evenly distributed because the cam nuts 12 are rotated with different torques. Accordingly, a defect of temperature distribution may occur and maintenance and repair operations may be required.

However, by installing the upper electrode 10 in the etching facility through the fastening automation apparatus of the present inventive concept using the plurality of fastening modules 120, the area in which the upper electrode 10 contacts the etching facility may be evenly distributed. Accordingly, it is possible to prevent the occurrence of defect of temperature distribution. In addition, an installation time of the upper electrode 10 can be shortened by installing the upper electrode 10 in the etching facility through the fastening automation apparatus for an upper electrode 100.

Hereinafter, an operation of a fastening apparatus for an upper electrode 100 according to an example embodiment of the present inventive concept will be described with reference to the drawings.

Figure 4:
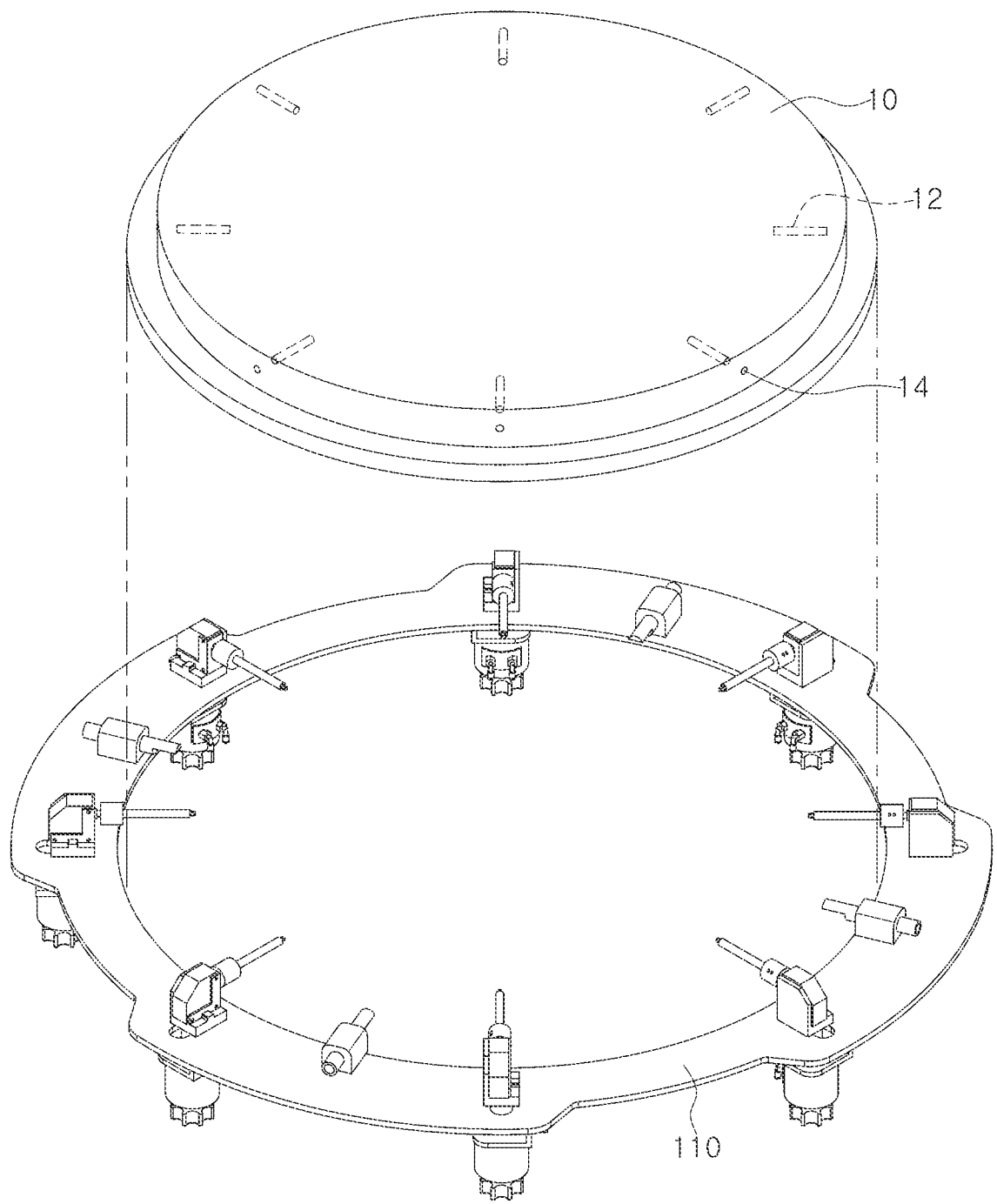
FIGS. 4 to 6 are illustrative diagrams illustrating an operation of a fastening automation module for an upper electrode according to an example embodiment.

First, as shown in FIG. 4, a fastening automation apparatus 100 is disposed so that an upper electrode 10 is disposed at a center of a ring 110. In this case, a fastening bit 180 is disposed so as to be spaced apart from an installation hole 14 by a predetermined distance in which a cam nut 12 of the upper electrode 10 is installed.

Figure 5:
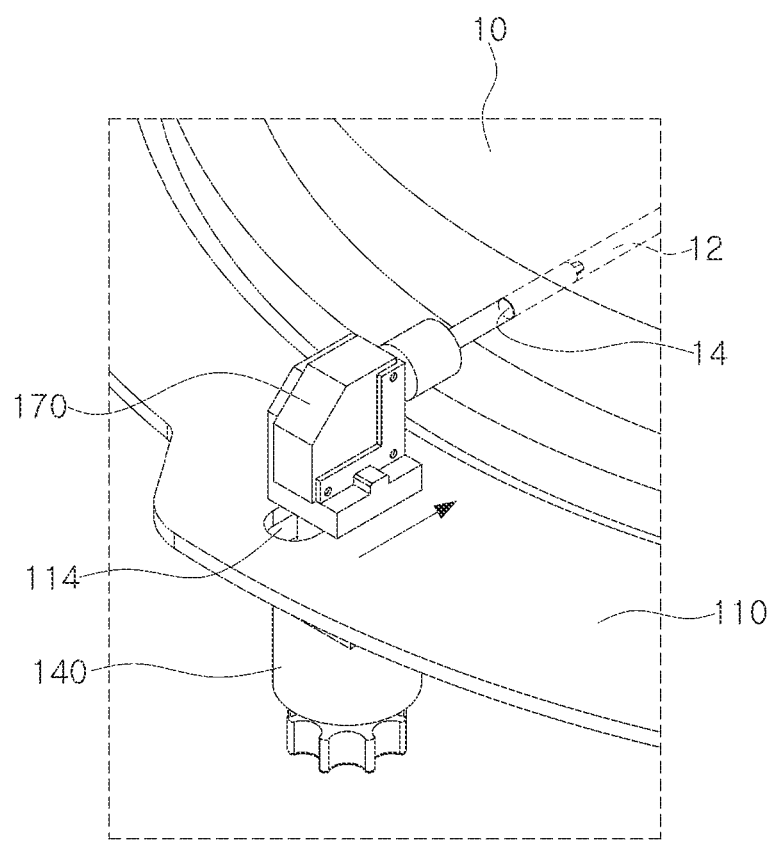

Thereafter, as shown in FIG. 5, the plurality of fastening modules 120 are simultaneously moved in a radial direction of the ring 110. In other words, a first frame 130 of the plurality of fastening modules 120 is moved along a guide member 112 (see FIG. 3) of the ring 110 so that the fastening bit 180 moves forward. Accordingly, the fastening bit 180 is inserted into the installation hole 14 and coupled to the cam nut 12.

Figure 6:
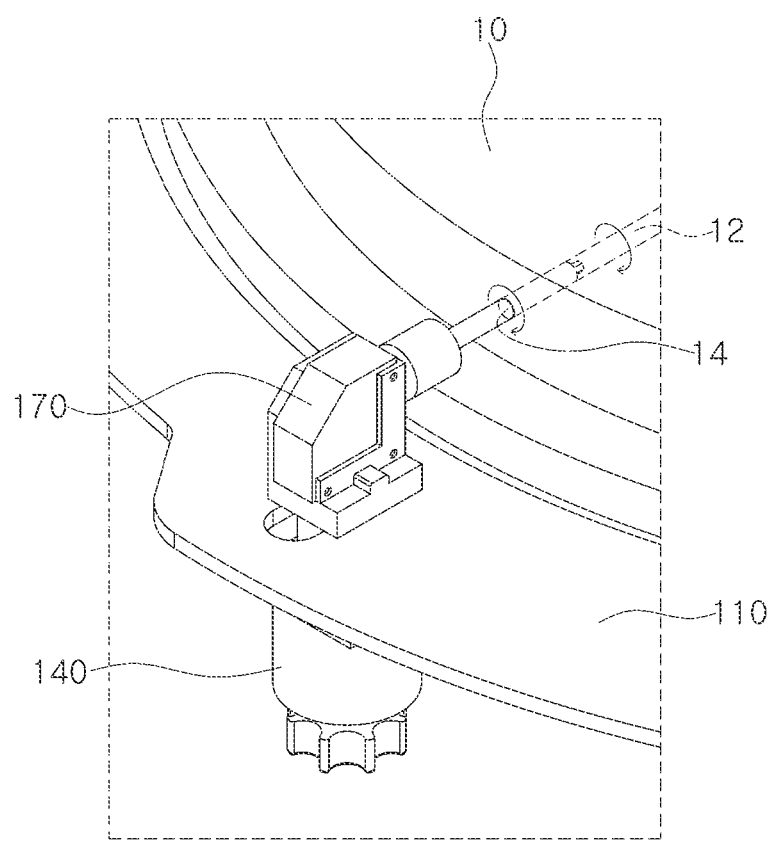

Thereafter, as shown in FIG. 6, while the fastening bit 180 is rotated by the driving source 140, the upper electrode 10 is coupled to the etching facility. In other words, the driving source 140 provided in each of the plurality of fastening modules 120 is operated to rotate the fastening bit 180 provided in each of the plurality of fastening modules 120. Accordingly, the cam nuts 12 of the upper electrode 10 are rotated and fixed to a cam bolt (not shown) of the etching facility, and the upper electrode 10 is installed in the etching facility. As described above, the plurality of fastening modules 120 simultaneously operate to rotate the cam nuts 12 to couple the upper electrode 10 to the etching facility, so that the upper electrode 10 may be in even surface-contact in the etching facility. Therefore, a defect in temperature distribution caused by uneven surface contact may be improved.

In other words, by rotating the cam nuts 12 of the upper electrode 12 simultaneously through the plurality of fastening modules 120, the upper electrode 10 of the etching facility may be installed in the etching facility. Accordingly, by rotating the cam nuts 12 with the same torque to install the upper electrode in the etching facility, the upper electrode 10 can be in even surface-contact with the etching facility. Accordingly, a defect in temperature distribution caused by an uneven surface contact may be improved.

That is, conventionally, by rotating the cam nuts 12 of the upper electrode 10 by an operator, the upper electrode 10 of the etching facility was installed in the etching facility, and accordingly, there has been a problem that an area in which the upper electrode 10 contacts the etching facility is not evenly distributed. Accordingly, there has been a problem in that a defect of temperature distribution occurs and maintenance and repair operations must be performed again.

However, by installing the upper electrode 10 in the etching facility using the fastening automation apparatus of the present inventive concept with the plurality of fastening modules 120, the area in which the upper electrode 10 contacts the etching facility may be evenly distributed. Accordingly, it is possible to prevent the occurrence of defect of temperature distribution.

In addition, an installation time of the upper electrode 10 can be shortened by installing the upper electrode 10 in the etching facility through the fastening automation apparatus of the present inventive concept.

As set forth above, according to the present inventive concept, it is possible to provide a fastening apparatus for an upper electrode in which a contact area between an upper electrode and an etching facility may be evenly distributed throughout the upper electrode.

The various and advantageous advantages and effects of the present inventive concept are not limited to the above description, and can be more easily understood in the course of describing a specific embodiment of the present inventive concept.

While example embodiments have been illustrated and described above, it will be apparent to those skilled in the art that modifications and variations could be made without departing from the scope of the present inventive concept as defined by the appended claims.

What is claimed is:

1. A fastening apparatus, comprising:
   a ring;
   a plurality of fastening modules movably secured to the ring, wherein each fastening module is movable in a radial direction on the ring; and
   a plurality of guide members installed on the ring, wherein each guide member guides movement of a respective one of the plurality of fastening modules;
   wherein each one of the plurality of fastening modules comprises a first frame that is movable in the radial direction, a driving source installed below the first frame, a driving shaft that transmits a driving force from the driving source, a power transmission unit connected to the driving shaft, and a fastening bit connected to the power transmission unit that rotates; and
   wherein the plurality of fastening modules operate simultaneously to install an upper electrode of an etching facility in the etching facility.

2. The fastening apparatus of claim 1, wherein each guide member comprises a linear motion (LM) guide.

3. The fastening apparatus claim 1, further comprising a second frame disposed above the ring and in which the power transmission unit is installed.

4. The fastening apparatus of claim 1, wherein the driving source comprises a rotary cylinder provided with a pneumatic port.

5. The fastening apparatus of claim 1, wherein the power transmission unit comprises a plurality of bevel gears.

6. The fastening apparatus of claim 1, wherein the plurality of fastening modules are in circumferentially spaced apart relationship on the ring.

7. The fastening apparatus of claim 1, wherein at least an end of the fastening bit has a cross-sectional shape corresponding to a shape of a cam nut installed on the upper electrode.

8. The fastening apparatus of claim 1, wherein the ring is provided with a plurality of through-holes, each through-hole having an elliptical shape, and wherein the driving shaft of each fastening module penetrates through a respective one of the through-holes.

9. The fastening apparatus of claim 1, further comprising a control unit connected to the driving source of each of the plurality of fastening modules, wherein the control unit controls operation of the driving source of each of the plurality of fastening modules.

10. A fastening apparatus, comprising:
    a ring; and
    a plurality of fastening modules movably secured to the ring, wherein each fastening module is movable in a radial direction on the ring;
    wherein each one of the plurality of fastening modules comprises a first frame that is movable in the radial direction, a driving source installed below the first frame, a driving shaft that transmits a driving force from the driving source, a power transmission unit connected to the driving shaft, wherein the power transmission unit comprises a plurality of bevel gears, and a fastening bit connected to the power transmission unit that rotates; and wherein the plurality of fastening modules operate simultaneously to install an upper electrode of an etching facility in the etching facility.

11. The fastening apparatus of claim 10, further comprising a plurality of guide members installed on the ring, wherein each guide member guides movement of a respective one of the plurality of fastening modules.

12. The fastening apparatus claim 10, further comprising a second frame disposed above the ring and in which the power transmission unit is installed.

13. The fastening apparatus of claim 10, wherein the driving source comprises a rotary cylinder provided with a pneumatic port.

14. The fastening apparatus of claim 10, wherein the plurality of fastening modules are in circumferentially spaced apart relationship on the ring.

15. The fastening apparatus of claim 10, wherein the ring is provided with a plurality of through-holes, each through-hole having an elliptical shape, and wherein the driving shaft of each fastening module penetrates through a respective one of the through-holes.

16. The fastening apparatus of claim 10, further comprising a control unit connected to the driving source of each of the plurality of fastening modules, wherein the control unit controls operation of the driving source of each of the plurality of fastening modules.

17. A fastening apparatus, comprising:
a ring; and
a plurality of fastening modules movably secured to the ring, wherein each one of the plurality of fastening modules is movable in a radial direction on the ring, wherein the plurality of fastening modules operate simultaneously to install an upper electrode of an etching facility in the etching facility;

wherein each one of the plurality of fastening modules comprises a first frame that is movable in the radial direction, a driving source installed below the first frame, a driving shaft that transmits a driving force from the driving source, a power transmission unit connected to the driving shaft, and a fastening bit connected to the power transmission unit that rotates, wherein at least an end of the fastening bit has a cross-sectional shape corresponding to a shape of a cam nut installed on the upper electrode.

18. The fastening apparatus of claim 17, further comprising a plurality of guide members installed on the ring, wherein each guide member guides movement of a respective one of the plurality of fastening modules.

19. The fastening apparatus claim 17, further comprising a second frame disposed above the ring and in which the power transmission unit is installed.

20. The fastening apparatus of claim 17, further comprising a control unit connected to the driving source of each of the plurality of fastening modules, wherein the control unit controls operation of the driving source of each of the plurality of fastening modules.

* * * * *